United States Patent
Nakajima et al.

(10) Patent No.: US 12,078,890 B2
(45) Date of Patent: Sep. 3, 2024

(54) BARRIER FILM, AND WAVELENGTH CONVERSION SHEET, BACK LIGHT, AND LIQUID CRYSTAL DISPLAY DEVICE WHICH USE SAME

(71) Applicant: DAI NIPPON PRINTING CO., LTD., Tokyo (JP)

(72) Inventors: Tatsuji Nakajima, Abiko (JP); Ryutaro Harada, Tokyo (JP); Takeshi Sakamoto, Fujimino (JP); Shuichi Tamura, Misato (JP); Akihito Haruki, Saitama (JP); Shota Yamanishi, Nagareyama (JP); Ryoma Yasui, Nagareyama (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 18/041,649

(22) PCT Filed: Aug. 3, 2021

(86) PCT No.: PCT/JP2021/028683
§ 371 (c)(1),
(2) Date: Feb. 14, 2023

(87) PCT Pub. No.: WO2022/039013
PCT Pub. Date: Feb. 24, 2022

(65) Prior Publication Data
US 2023/0305335 A1 Sep. 28, 2023

(30) Foreign Application Priority Data
Aug. 19, 2020 (JP) .................. 2020-138756

(51) Int. Cl.
*G02F 1/1335* (2006.01)
*F21V 8/00* (2006.01)
*G02F 1/13357* (2006.01)

(52) U.S. Cl.
CPC ....... *G02F 1/133614* (2021.01); *G02B 6/005* (2013.01); *G02F 1/133606* (2013.01); *G02F 2202/36* (2013.01)

(58) Field of Classification Search
CPC ......... G02F 1/133614; G02F 1/133606; G02F 2202/36; G02B 6/005
See application file for complete search history.

(56) References Cited

U.S. PATENT DOCUMENTS

2016/0327719 A1   11/2016   Kitahara et al.
2018/0231693 A1   8/2018    Murata et al.

FOREIGN PATENT DOCUMENTS

JP   2015-018131       1/2015
JP   2017100350 A  *   6/2017
(Continued)

OTHER PUBLICATIONS

International Search Report of PCT/JP2021/028683, Nov. 2, 2021, 5 pages including English translation.
(Continued)

*Primary Examiner* — Mariceli Santiago
(74) *Attorney, Agent, or Firm* — HSML P.C.

(57) ABSTRACT

Provided is a barrier film that can suppress a change in color when applied to a wavelength conversion sheet. A barrier film for a wavelength conversion sheet, comprising an inorganic oxide layer A, an organic coating layer B, an inorganic oxide layer C, and a primer layer D in presented order on a light-transmitting base material, wherein thicknesses of the light-transmitting base material, the inorganic oxide layer A, the organic coating layer B, the inorganic (Continued)

oxide layer C, and the primer layer D are defined as $t_O$, $t_A$, $t_B$, $t_C$, and $t_D$, respectively; $t_B$ is 150 nm or more and 500 nm or less; and $t_D/t_B$ is 0.55 or more and 1.65 or less.

9 Claims, 2 Drawing Sheets

(56) References Cited

FOREIGN PATENT DOCUMENTS

| JP | 2017-159576 | 9/2017 |
| JP | 2019044136 A | 3/2019 |
| JP | 2019-126924 | 8/2019 |
| JP | 2020-019141 | 2/2020 |
| JP | 2020-187357 | 11/2020 |
| WO | 2012/132239 | 10/2012 |
| WO | 2017126609 A1 | 7/2017 |

OTHER PUBLICATIONS

Written Opinion of PCT/JP2021/028683, Nov. 2, 2021, 6 pages including English translation.
Office Action issued for Japanese Patent Application No. 2020-196029 on Feb. 24, 2021, 5 pages including machine translation.
Office Action issued for Japanese Patent Application No. 2020-196029 on Sep. 14, 2021, 3 pages including machine translation.
Extended European Search Report issued for European Patent Application No. 21858161.9, dated Jul. 10, 2024, 8 pages.

\* cited by examiner

[Fig. 1]
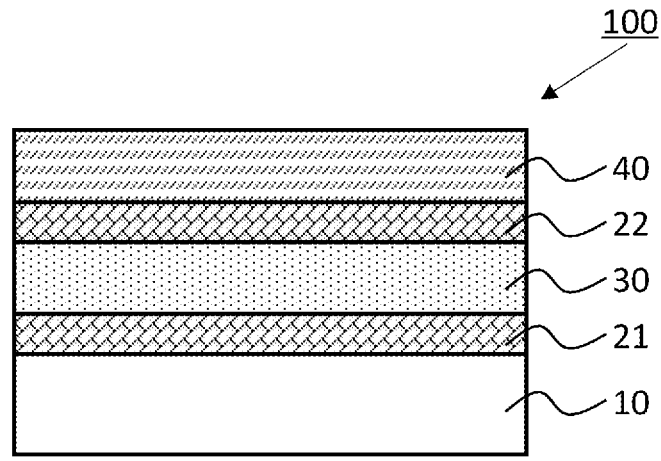
[Fig. 2]
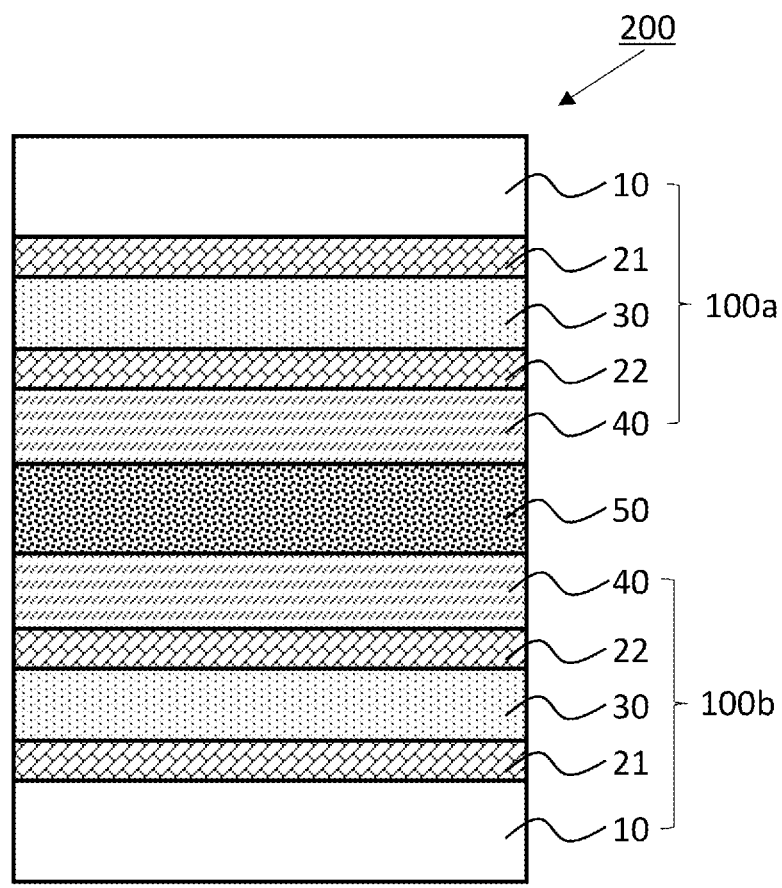

[Fig. 3]
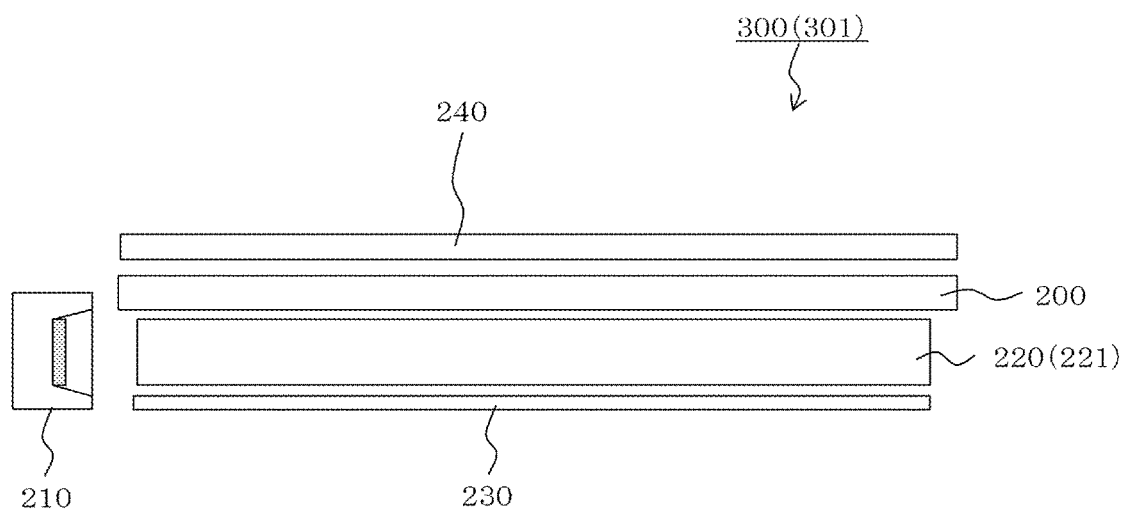
[Fig. 4]
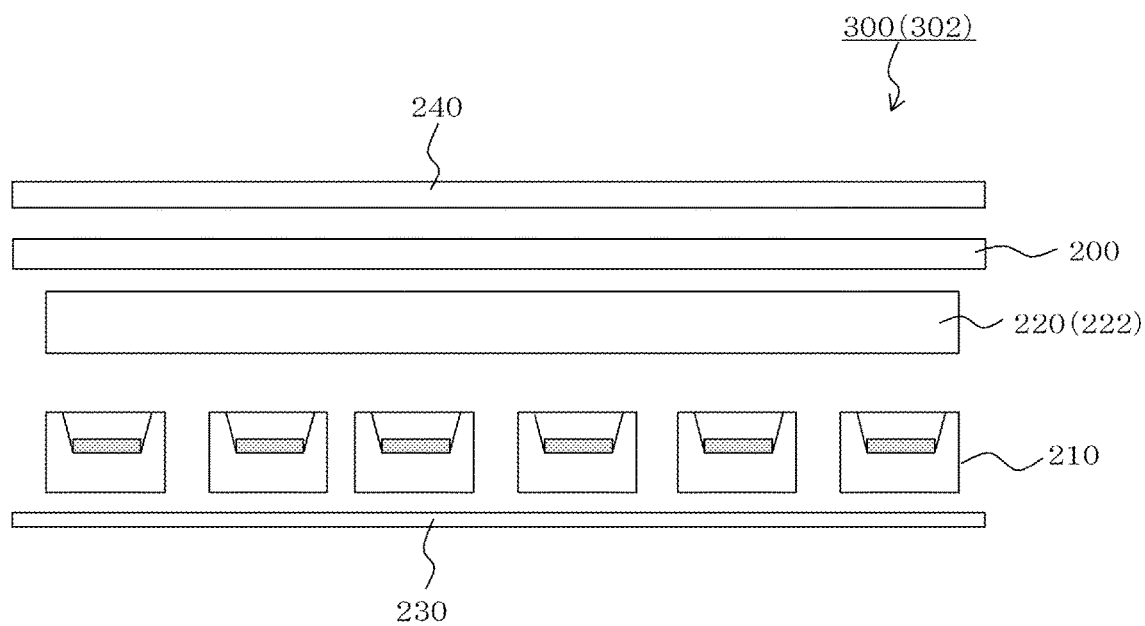

BARRIER FILM, AND WAVELENGTH CONVERSION SHEET, BACK LIGHT, AND LIQUID CRYSTAL DISPLAY DEVICE WHICH USE SAME

TECHNICAL FIELD

The present disclosure relates to a barrier film, and a wavelength conversion sheet, a backlight, and a liquid crystal display device using the barrier film.

BACKGROUND ART

With the development of a personal computer such as a portable personal computer, the demand for a liquid crystal display device has been increasing. In addition, recently, the penetration rate of a home-use liquid crystal display television has been increasing, and further, a smartphone and a tablet terminal have also been becoming widespread. Because of these, the present situation is that the market for a liquid crystal display device is expanding further.

Such a liquid crystal display device is generally configured to have a color filter, a liquid crystal cell, and a backlight. In addition, the liquid crystal display device generally controls the intensity of light by the shutter function of the liquid crystal layer in a liquid crystal cell, and displays an image by displaying the color of each pixel by dividing the color into the three primary colors of R, G, and B using color filters.

Conventionally, a cold cathode tube has been used as a light source of the backlight of the liquid crystal display device. However, in view of low power consumption and space saving, the light source of the backlight has been switched from the cold cathode tube to an LED.

As the LED used as a light source of a normal backlight, what is called a white LED formed by combining a blue LED and a YAG-based yellow phosphor is used. Such a white LED has a broad spectral distribution of emission wavelength and is called pseudo-white.

On the other hand, in recent years, the development of a backlight using quantum dot technology has also been promoted. The quantum dot refers to a nanometer-sized fine particle of a semiconductor.

The basic configuration of a backlight using a quantum dot is a combination of a light source that generates primary light (such as a blue LED that emits blue light) and a quantum dot.

The quantum dot is, for example, a nano-sized compound semiconductor fine particle composed of a semiconductor fine particle composed of a core which is CdSe and a shell which is ZnS, and a ligand which covers the periphery of the shell. The particle size of the quantum dot is smaller than the Bohr radius of an exciton of the compound semiconductor, and thus the quantum confinement effect appears. Because of this, the quantum dot has a higher light emission efficiency than the conventionally used phosphor using a rare earth ion as an activator, and can realize a high light emission efficiency of 90% or more.

In addition, the emission wavelength of the quantum dot is determined by the bandgap energy of the compound semiconductor fine particle quantized as described above, and thus an arbitrary emission spectrum can be obtained by changing the particle size of the quantum dot. A backlight that combines such a quantum dot with a blue LED or the like can realize high light emission efficiency and high color purity (see, for example, Patent Literatures 1 and 2).

While the quantum dot has the above excellent characteristics, a problem thereof is that the quantum dot is easily degraded by the influence of moisture, oxygen, or the like. Because of this, it is preferable to protect the surfaces of both sides of a quantum dot-containing layer with a barrier film.

Patent Literatures 3 and 4 propose a wavelength conversion sheet in which a quantum dot-containing layer is protected by a barrier film having a base material, an inorganic oxide layer, and an organic coating layer.

CITATION LIST

Patent Literature

PTL1: WO 2012/132239
PTL2: JP 2015-18131 A
PTL3: JP 2019-126924 A
PTL4: JP 2020-19141 A

SUMMARY OF INVENTION

Technical Problem

However, there were some cases where an image having a color different from the initial one was visually recognized while the liquid crystal display device using the wavelength conversion sheet of each of Patent Literatures 3 and 4 was continuously used. That is, there were some cases where the color was remarkably different when the color at the initial time point and the color at an arbitrary time point were compared in the liquid crystal display device using the wavelength conversion sheet of each of Patent Literatures 3 and 4. A quantum dot is characterized by increasing color purity. Accordingly, the instability of the color of the liquid crystal display device using the quantum dot is an extremely important problem in terms of quality because the characteristic of the liquid crystal display device is impaired.

In view of the above problem, it is an object of the present disclosure to provide a barrier film that can suppress a change in color when applied to a wavelength conversion sheet. In addition, it is another object of the present disclosure to provide a wavelength conversion sheet, a backlight, and a liquid crystal display device using the barrier film.

Solution to Problem

The present inventors have carried out diligent research to achieve the above objects and as a result found that when a wavelength conversion sheet to which a barrier film is applied is exposed to a high humidity environment, an organic coating layer of the barrier film swells, which is a cause of the change in color. Therefore, the present inventors have studied reduction of the thickness of the organic coating layer to such an extent that the barrier property is not affected. However, even if the thickness of the organic coating layer was reduced, there were many cases where the color changed.

Then, the present inventors have further carried out diligent research and as a result found that by setting the thickness of the organic coating layer in a predetermined range and setting the ratio between the thickness of a primer layer formed in order to improve the close adhesion to the quantum dot-containing layer and the thickness of the organic coating layer in a predetermined range, the change in color of a wavelength conversion sheet or the like to which a barrier film is applied can be suppressed.

The present disclosure provides the following [1] to [6].

[1] A barrier film for a wavelength conversion sheet, comprising an inorganic oxide layer A, an organic coating layer B, an inorganic oxide layer C, and a primer layer D in presented order on a light-transmitting base material, wherein
thicknesses of the light-transmitting base material, the inorganic oxide layer A, the organic coating layer B, the inorganic oxide layer C, and the primer layer D are defined as $t_0$, $t_A$, $t_B$, $t_C$, and $t_D$, respectively;
$t_B$ is 150 nm or more and 500 nm or less; and
$t_D/t_B$ is 0.55 or more and 1.65 or less.

[2] The barrier film according to [1], wherein the inorganic oxide layer A and the inorganic oxide layer C comprise aluminum oxide or silicon oxide.

[3] The barrier film according to [1] or [2], wherein the organic coating layer B comprises polyvinyl alcohol.

[4] A wavelength conversion sheet comprising: a quantum dot-containing layer comprising a quantum dot; and barrier films respectively laminated on both sides of the quantum dot-containing layer, wherein the barrier film is the barrier film according to any one of [1] to [3] and the barrier film is laminated such that a surface of an opposite side thereof from the light-transmitting base material faces a side of the quantum dot-containing layer.

[5] A backlight comprising: at least one light source that emits primary light; an optical plate that is disposed adjacent to the light source and is for light guiding or diffusion; and a wavelength conversion sheet disposed on a light going-out side of the optical plate, wherein the wavelength conversion sheet is the wavelength conversion sheet according to [4].

[6] A liquid crystal display device comprising: a backlight; and a liquid crystal panel, wherein the backlight is the backlight according to [5].

Advantageous Effects of Invention

The barrier film, and the wavelength conversion sheet, the backlight, and the liquid crystal display device using the barrier film according to the present disclosure can suppress a change in color.

BRIEF DESCRIPTION OF DRAWINGS

FIG. 1 is a cross-sectional view showing one embodiment of the barrier film of the present disclosure.

FIG. 2 is a cross-sectional view showing one embodiment of the wavelength conversion sheet of the present disclosure.

FIG. 3 is a cross-sectional view showing one embodiment of the backlight of the present disclosure.

FIG. 4 is a cross-sectional view showing another embodiment of the backlight of the present disclosure.

DESCRIPTION OF EMBODIMENTS

Hereinafter, embodiments of the present disclosure will be described.

As used herein, the notation "AA to BB" means AA or more and BB or less.

As used herein, the refractive index of each layer means the refractive index at a wavelength of 632.8 nm. The refractive index of each layer can be calculated, for example, by fitting a reflection spectrum measured by a reflection photometer and a reflection spectrum calculated from an optical model of a multilayer thin film using a Fresnel coefficient.

[Barrier Film]

The barrier film of the present disclosure is a barrier film for use in a wavelength conversion sheet, comprising an inorganic oxide layer A, an organic coating layer B, an inorganic oxide layer C, and a primer layer D in presented order on a light-transmitting base material; wherein
thicknesses of the light-transmitting base material, the inorganic oxide layer A, the organic coating layer B, the inorganic oxide layer C, and the primer layer D are defined as $t_0$, $t_A$, $t_B$, $t_C$, and $t_D$, respectively;
$t_B$ is 150 nm or more and 500 nm or less; and
$t_D/t_B$ is 0.55 or more and 1.65 or less.

FIG. 1 is a cross-sectional view showing an embodiment of a barrier film (100) of the present disclosure. The barrier film (100) of FIG. 1 has an inorganic oxide layer A (21), an organic coating layer B (30), an inorganic oxide layer C (22), and a primer layer D (40) in presented order on a light-transmitting base material (10).

<Light-transmitting Base Material>

The light-transmitting base material is not particularly limited as long as it is a resin film that does not impair a function of a wavelength conversion sheet when applied to the wavelength conversion sheet.

Examples of the light-transmitting base material include resin films formed of one or more resins selected from the group consisting of polyester, triacetyl cellulose (TAC), cellulose diacetate, cellulose acetate butyrate, polyamide, polyimide, polyethersulfone, polysulfone, polypropylene, polymethylpentene, polyvinyl chloride, polyvinyl acetal, polyether ketone, acrylic, polycarbonate, polyurethane, an amorphous olefin (Cyclo-Olefin-Polymer: COP), and the like.

Among these resin films, a stretched polyester film, particularly a biaxially stretched polyester film, is preferable in view of mechanical strength, dimensional stability, and heat resistance. Examples of the polyester film include a polyethylene terephthalate film and a polyethylene naphthalate film.

The light-transmitting base material may be a single layer of a resin film or may have a plurality of resin films. When the light-transmitting base material has a plurality of resin films, each resin film may be directly bonded or may be bonded via an adhesive layer.

The thickness $t_0$ of the light-transmitting base material is preferably 5 μm or more, more preferably 8 μm or more, and further preferably 10 μm or more. By setting the thickness of the light-transmitting base material to 5 μm or more, the strength of the barrier film can be easily improved.

The thickness $t_0$ of the light-transmitting base material is preferably 200 μm or less, more preferably 150 μm or less, more preferably 100 μm or less, more preferably 50 μm or less, and more preferably 25 μm or less, in view of thinning and easily suppressing invasion by water vapor and oxygen from an end portion.

Herein, the thickness of each layer constituting the barrier film such as the thickness $t_0$ of the light-transmitting base material, and the thickness of the quantum dot-containing layer can be calculated, for example, by photographing a cross section using a scanning transmission electron microscope (STEM), measuring the thicknesses at 20 points from an image of the cross section, and averaging the values at the 20 points.

Herein, when measuring various parameters such as the thickness of each layer, the total light transmittance, and the color (x value and y value in the Yxy color system), the measurement is carried out in an atmosphere having a temperature of 23° C.±5° C. and a relative humidity of 40% or more and 65% or less, unless otherwise specified. Further, a sample is exposed to the atmosphere for at least 30 minutes before measuring various parameters.

When a plurality of upper limit options and a plurality of lower limit options of a numerical value are indicated in a constitutional requirement shown herein, one selected from the upper limit options and one selected from the lower limit options can be combined to provide an embodiment of a numerical range. For example, in the case of the thickness $t_0$ of the light-transmitting base material, examples of the embodiment of a numerical range include 5 μm or more and 200 μm or less, 5 μm or more and 25 μm or less, 8 μm or more and 50 μm or less, 10 μm or more and 50 μm or less, and 10 μm or more and 25 μm or less.

When the light-transmitting base material is constituted by two resin films, the thickness of a first resin film on the side close to the inorganic oxide layer A is preferably 5 μm or more and 50 μm or less, more preferably 8 μm or more and 25 μm or less, and further preferably 10 μm or more and 20 μm or less. When the first resin film has the above thickness, the production efficiency of the inorganic oxide layer can be easily improved and the handleability can be easily improved.

In addition, the thickness of a second resin film on the side far from the inorganic oxide layer A is preferably 5 μm or more and 150 μm or less, more preferably 8 μm or more and 100 μm or less, and further preferably 10 μm or more and 50 μm or less. When the second resin film has the above thickness, the balance between the handleability and the rigidity of the barrier film can be easily improved.

When the light-transmitting base material is constituted by two resin films, the two resin films may be bonded to each other via an adhesive layer, followed by forming the inorganic oxide layer A or the like. Alternatively, after the inorganic oxide layer A or the like is formed on the first resin film, the second resin film may be bonded to the surface of the opposite side of the first resin film from the inorganic oxide layer A or the like via an adhesive layer. The thickness of the adhesive layer is preferably 3 μm or more and 100 μm or less, more preferably 3 μm or more and 50 μm or less, and further preferably 4 μm or more and 8 μm or less. If the thickness of the adhesive layer is too small, poor coating may occur, and if the thickness is too large, curing may be insufficient.

The total light transmittance according to JIS K7361-1: 1997 of the light-transmitting base material is preferably 80% or more, more preferably 85% or more, and further preferably 87% or more.

A desired surface treatment may be applied in advance to the surface of the side of the light-transmitting base material on which the inorganic oxide layer A is provided, in order to improve close adhesion or the like. Examples of the surface treatment include corona discharge treatment, ozone treatment, low temperature plasma treatment using oxygen gas, nitrogen gas, or the like, glow discharge treatment, and oxidation treatment using a chemical or the like.

<Inorganic Oxide Layer>

The barrier film of the present disclosure has an inorganic oxide layer A and an inorganic oxide layer C as the inorganic oxide layer. By having the two inorganic oxide layers as described above, the barrier property of the barrier film against oxygen and water vapor can be improved to easily suppress the degradation of the quantum dot. In addition, if an attempt is made to improve the barrier property by a single inorganic oxide layer, the thickness of the inorganic oxide layer becomes large so that a crack is likely to occur in the inorganic oxide layer, and thus it is difficult for the barrier property to be kept good for a long period of time. However, by having two inorganic oxide layers, it is possible to suppress the increase in the thickness of each inorganic oxide layer so that a crack is unlikely to occur, and it is thus easy to keep the barrier property good for a long period of time.

Even if the thickness of the inorganic oxide layer is reduced, a crack or a pinhole may occur. However, even if a crack or a pinhole occurs in each of the two inorganic oxide layers, it is possible to impart a predetermined barrier property as a laminated body as long as the positions of the cracks or pinholes do not match in the plane direction. In other words, it is preferable to use two inorganic oxide layers in that it is easy to impart a predetermined barrier property even when cracks or pinholes occur in the inorganic oxide layers.

Examples of the inorganic oxide layer A and the inorganic oxide layer C include a layer made of one selected from the group consisting of aluminum oxide, magnesium oxide, indium tin oxide (ITO), and silicon oxide, or a mixture thereof. The compositions of the inorganic oxide layer A and the inorganic oxide layer C may be the same or different.

The inorganic oxide layer A and the inorganic oxide layer C are preferably layers including aluminum oxide or silicon oxide from the viewpoint of transparency, productivity, and the like.

In addition, at least one of the inorganic oxide layer A and the inorganic oxide layer C is preferably a layer including aluminum oxide from the viewpoint of a sufficient barrier property, transparency, productivity, and the like, and both of the inorganic oxide layer A and the inorganic oxide layer C are more preferably layers including aluminum oxide.

The content of aluminum oxide or silicon oxide in the inorganic oxide layer A or the inorganic oxide layer C is preferably 80% by mass or more, more preferably 90% by mass or more, and further preferably 95% by mass or more on a mass basis.

Examples of an embodiment of a combination of the inorganic oxide layer A and the inorganic oxide layer C include the following (1) to (4).

(1) An embodiment in which the inorganic oxide layer A and the inorganic oxide layer C are each a layer including aluminum oxide
(2) An embodiment in which the inorganic oxide layer A and the inorganic oxide layer C are each a layer including silicon oxide
(3) An embodiment in which the inorganic oxide layer A is a layer including aluminum oxide, and the inorganic oxide layer C is a layer including silicon oxide
(4) An embodiment in which the inorganic oxide layer A is a layer including silicon oxide, and the inorganic oxide layer C is a layer including aluminum oxide Among the above (1) to (4), (1), (3), and (4) are preferable, and (1) is more preferable, from the viewpoint of the barrier property.

On the other hand, the barrier film may be laminated with another member, and a predetermined tension is applied to the barrier film at the time of lamination. The split prevention property against the tension of the layer including silicon oxide is superior to that of the layer including aluminum oxide. Therefore, from the viewpoint of the split prevention property against the tension, (2) to (4) are preferable, and (2) is more preferable.

From the above, (3) and (4) are preferable from the viewpoint of the balance between the barrier property and the split prevention property of the inorganic oxide layer against the tension. In addition, the layer including silicon oxide tends to generate a pinhole more easily when forming an inorganic oxide layer than the layer including aluminum oxide. When comparing (3) and (4), (4) is preferable in that even if a pinhole is generated in the layer including silicon oxide, the pinhole is filled by the organic coating layer B, and it is easy to maintain the barrier property.

When the thickness of the inorganic oxide layer is too small, the barrier property tends to decrease, and when the thickness is too large, a scratch or a crack tends to easily occur. The thickness $t_A$ of the inorganic oxide layer A and the thickness $t_C$ of the inorganic oxide layer C are preferably set in an appropriate range depending on the materials of the inorganic oxide layers so as to have a good balance among the barrier property, scratch suppression, and crack suppression.

For example, when the inorganic oxide layer A and the inorganic oxide layer C are layers including aluminum oxide, the lower limit of each of $t_A$ and $t_C$ is 6 nm or more, and more preferably 7 nm or more. By setting $t_A$ and $t_C$ to 6 nm or more, the barrier property can be easily improved.

In terms of the upper limit, each of $t_A$ and $t_C$ is preferably 25 nm or less, more preferably 20 nm or less, more preferably 15 nm or less, more preferably 12 nm or less, and more preferably 10 nm or less. By setting $t_A$ and $t_C$ to 25 nm or less, the occurrence of a scratch and a crack in the inorganic oxide layer A and the inorganic oxide layer C can be easily suppressed.

In addition, when the inorganic oxide layer A and the inorganic oxide layer C are layers including any one or more of silicon oxide, magnesium oxide, and indium tin oxide (ITO), the lower limit of each of $t_A$ and $t_C$ is preferably 20 nm or more, more preferably 25 nm or more, and more preferably 27 nm or more. By setting $t_A$ and $t_C$ to 20 nm or more, the barrier property can be easily improved.

In addition, the upper limit of each of $t_A$ and $t_C$ is preferably 100 nm or less, more preferably 75 nm or less, further preferably 60 nm or less, and more further preferably 50 nm or less. By setting $t_A$ and $t_C$ to 100 nm or less, the occurrence of a scratch and a crack in the inorganic oxide layer A and the inorganic oxide layer C can be easily suppressed.

The inorganic oxide layer can be formed, for example, by physical vapor deposition method such as a vacuum vapor deposition method, a sputtering method, and an ion plating method, or a chemical vapor deposition method such as a plasma chemical vapor deposition method, a thermochemical vapor deposition method, and a photochemical vapor deposition method. Among these, the vacuum vapor deposition method, which has a high vapor deposition rate and good productivity, is preferable.

<Organic Coating Layer>

The barrier film of the present disclosure has an organic coating layer B as the organic coating layer. By having an organic coating layer in combination with an inorganic oxide layer, the barrier property of the barrier film can be improved to easily suppress the degradation of the quantum dot. In addition, the organic coating layer has better flexibility than the inorganic oxide layer, and thus by the organic coating layer B, the occurrence of a scratch and a crack in the inorganic oxide layer A and the inorganic oxide layer C can be easily suppressed. The organic coating layer B is preferably in contact with the inorganic oxide layer A and the inorganic oxide layer C in the thickness direction of the barrier film.

The thickness $t_B$ of the organic coating layer B is required to be 150 nm or more and 500 nm or less. $t_B$ is preferably 175 nm or more and 450 nm or less, and more preferably 200 nm or more and 400 nm or less.

When $t_B$ is less than 150 nm, the barrier property of the barrier film is insufficient, the quantum dot of the quantum dot-containing layer deteriorates, and the like, resulting in a change in color over time.

In addition, when $t_B$ exceeds 500 nm, a problem with the barrier property is unlikely to occur, but the change in color cannot be suppressed. As $t_B$ increases, the amount of change in thickness due to swelling of the organic coating layer B in a high humidity environment increases. It is considered that because of this, the action of thin film interference changes greatly and the waveform of the spectral transmittance of the barrier film shifts, and thus the change in color cannot be suppressed. More specifically, the spectral transmittance of the barrier film has a value that varies depending on the wavelength, and increases or decreases in a predetermined cycle. Therefore, when the organic coating layer B swells and the waveform of the spectral transmittance of the barrier film shifts to the long wavelength side or the short wavelength side, the spectral transmittance at a specific wavelength (for example, a wavelength of 450 nm) changes and thus the color changes.

In addition, if $t_B$ is too thick, the stress generated when the organic coating layer is applied and dried becomes large, and the stress may cause a crack in the inorganic oxide layers and reduce the barrier property. Because of this, by setting $t_B$ to 500 nm or less, the initial barrier property can be easily improved.

The organic coating layer B preferably includes one or more selected from the group consisting of a water-soluble polymer and a metal alkoxide-based compound. The organic coating layer B includes more preferably one or more selected from the group consisting of a water-soluble polymer, and further preferably one or more selected from the group consisting of a water-soluble polymer and one or more selected from the group consisting of a metal alkoxide-based compound, among a water-soluble polymer and a metal alkoxide-based compound.

Examples of the water-soluble polymer include polyvinyl alcohol, polyvinylpyrrolidone, and an ethylene-vinyl alcohol copolymer. Among these, polyvinyl alcohol and an ethylene-vinyl alcohol copolymer are preferable, and polyvinyl alcohol is more preferable, in view of the barrier property. That is, the organic coating layer B includes preferably one or more selected from the group consisting of polyvinyl alcohol and an ethylene-vinyl alcohol copolymer, and more preferably polyvinyl alcohol.

When the organic coating layer B contains a water-soluble polymer and a metal alkoxide-based compound, the content of the water-soluble polymer is preferably 5 parts by mass or more and 500 parts by mass or less, more preferably 7 parts by mass or more and 100 parts by mass or less, and further preferably 8 parts by mass or more and 50 parts by mass or less, per 100 parts by mass in total of the metal alkoxide-based compound.

Examples of the metal alkoxide-based compound include a metal alkoxide, a metal alkoxide hydrolysate, and a metal alkoxide polymer.

The metal alkoxide is a compound represented by the general formula $M(OR)_n$. In the formula, M represents a metal such as Si, Ti, Al, and Zr, and R represents an alkyl group such as a methyl group and an ethyl group. Specific examples of the metal alkoxide include tetramethoxysilane, tetraethoxysilane, and isopropoxyaluminum.

An organic coating layer B can be formed, for example, by applying a coating liquid including a component constituting the organic coating layer B on the inorganic oxide layer and drying the same. The coating liquid may contain an additive such as a silane coupling agent, a curing agent, or a dispersant.

<Primer Layer>

The barrier film of the present disclosure is required to have a primer layer D on an opposite side of the inorganic oxide layer C from the organic coating layer B. By having a primer layer, the close adhesion between the barrier film and the quantum dot-containing layer is improved, and the barrier property of the barrier film is easily maintained for a long period of time, and thus the change in color over time can be suppressed. In addition, it can also be expected that the primer layer D makes it easier to suppress the generation of a scratch and a crack in the inorganic oxide layer C.

The primer layer is preferably disposed at a position at which the primer layer is in contact with the inorganic oxide layer C. The primer layer is preferably disposed as the outermost layer of the barrier film.

The barrier film of the present disclosure requires that $t_D/t_B$, which is the ratio of the thickness $t_D$ of the primer layer D to the thickness $t_B$ of the organic coating layer B, be 0.55 or more and 1.65 or less. $t_D/t_B$ is preferably 0.60 or more and 1.50 or less, and more preferably 0.70 or more and 1.30 or less.

When $t_D/t_B$ is less than 0.55, if stress is generated by, for example, expansion and contraction of the barrier film, an excessive load is applied to the primer layer D that has a small thickness, and the interface of the primer layer D is easily peeled off. In addition, when $t_D/t_B$ exceeds 1.65, if stress is generated by, for example, expansion and contraction of the barrier film, an excessive load is applied to the organic coating layer B that has a small thickness, and the interface of the organic coating layer B is easily peeled off.

That is, when $t_D/t_B$ is 0.55 or more and 1.65 or less, it is possible to suppress the application of an excessive load to one of the organic coating layer B and the primer layer D when stress is generated, and thus the barrier property of the barrier film is easily maintained for a long period of time, and the change in color over time can be easily suppressed.

The thickness $t_D$ of the primer layer D is not particularly limited as long as $t_D/t_B$ is 0.55 or more and 1.65 or less.

$t_D$ is usually 82.5 nm or more and 825 nm or less, preferably 100 nm or more and 600 nm or less, and more preferably 125 nm or more and 400 nm or less.

<<Composition>>

The primer layer D preferably includes a resin component such as a polyurethane-based resin composition. The polyurethane-based resin easily improves the close adhesion to the quantum dot-containing layer, and also plays the role of alleviating the stress generated when the quantum dot-containing layer is ionizing radiation-cured or heat-cured, to thereby make it difficult for the stress to be transmitted to the inorganic oxide layers and the organic coating layers. Further, the polyurethane-based resin can improve the degree of extension of the primer layer D to thereby easily suppress the occurrence of a crack in layers constituting the barrier film such as the inorganic oxide layers.

Examples of the polyurethane-based resin composition include a one-pack or two-pack polyurethane-based resin composition obtained by reacting a polyfunctional isocyanate with a hydroxyl group-containing compound. Only one of each of the polyfunctional isocyanate and the hydroxyl group-containing compound may be used, or a plurality of each thereof may be used.

Specific examples of the polyfunctional isocyanate include an aromatic polyisocyanate such as tolylene diisocyanate, diphenylmethane diisocyanate, xylylene diisocyanate, or polymethylene polyphenylene polyisocyanate, and an aliphatic polyisocyanate such as hexamethylene diisocyanate or isophorone diisocyanate.

Examples of the hydroxyl group-containing compound include a polyether polyol, a polyester polyol, a polyester polyurethane polyol, and a polyacrylate polyol. In the present disclosure, a polyester polyurethane polyol is particularly preferable in view of close adhesion to the quantum dot-containing layer and durability. The polyester polyurethane polyol can be produced, for example, by the method described in JP 2001-288408 A or JP 2003-26996 A.

The content of the polyurethane-based resin composition is preferably 40% by mass or more and more preferably 70% by mass or more based on the total amount of the primer layer D.

The primer layer D may further contain a silane coupling agent. When the primer layer D contains the silane coupling agent, the close adhesion between the primer layer D and the inorganic oxide layer C can be easily improved. The silane coupling agent has a functional group at one end of the molecule thereof, usually a chloro, alkoxy, or acetoxy group or the like, and the functional group is hydrolyzed to form a silanol group (Si—OH), whereby the resin composition of the primer layer D is modified by a covalent bond or the like to form a strong bond. In addition, an organic functional group, such as vinyl, methacryloxy, amino-based, epoxy-based, or mercapto, at the other end of the silane coupling agent can easily improve the close adhesion between the primer layer D and the inorganic oxide layer C and between the primer layer D and the quantum dot-containing layer.

Examples of the silane coupling agent include γ-chloropropyltrimethoxysilane, vinyltrichlorosilane, vinyltriethoxysilane, vinyl-tris(β-methoxyethoxy)silane, γ-methacryloxypropyltrimethoxysilane, β-(3,4-epoxycyclohexyl)ethyltrimethoxysilane, γ-glycidoxypropyltrimethoxysilane, vinyltriacetoxysilane, γ-mercaptopropyltrimethoxysilane, N-β(aminoethyl)-γ-aminopropyltrimethoxysilane, N-β(aminoethyl)-γ-aminopropylmethyldimethoxysilane, γ-ureidopropyltriethoxysilane, bis(β-hydroxyethyl)-γ-aminopropyltriethoxysilane, and γ-aminopropylsilicone, and one or two or more thereof can be used.

The content of the silane coupling agent is preferably 1% by mass or more and more preferably 3% by mass or more based on the total amount of the primer layer D. When the content of the silane coupling agent is in the above range, the close adhesion between the primer layer D and the inorganic oxide layer C and between the primer layer D and the quantum dot-containing layer can be easily further improved.

For improving the extensibility of the primer layer D and suppressing the occurrence of a crack in the primer layer D, the content of the silane coupling agent is preferably 30% by mass or less and more preferably 20% by mass or less based on the total amount of the primer layer D.

The primer layer D may further include a filler. The filler has the role of adjusting the viscosity or the like of a coating liquid for forming a primer layer to improve the coating suitability or the like. As the filler, for example, calcium carbonate, barium sulfate, alumina white, silica, talc, a glass frit, or a resin powder can be used.

The primer layer may further include an additive such as a stabilizer, a crosslinking agent, a lubricant, or an ultraviolet absorber, as necessary.

The total thickness of the inorganic oxide layer A, the organic coating layer B, the inorganic oxide layer C, and the primer layer D is preferably 300 nm or more and 1200 nm or less, more preferably 400 nm or more and 900 nm or less, further preferably 500 nm or more and 800 nm or less, and further preferably 550 nm or more and 750 nm or less. By setting the total thickness to 300 nm or more, the barrier property can be easily improved. In addition, by setting the total thickness to 1200 nm or less, it is possible to suppress excessive shortening of the period of the waveform of the spectral transmittance and easily suppress a large change in spectral transmittance at a specific wavelength (for example, a wavelength of 450 nm) when the organic coating layer swells and the waveform of the spectral transmittance of the barrier film shifts to the long wavelength side or short wavelength side.

<Physical Properties>
<<Water Vapor Transmission Rate>>

The barrier film has a value of water vapor transmission rate according to JIS K7129-2:2019 of preferably 0.20 $g/m^2 \cdot day$ or less and more preferably 0.15 $g/m^2 \cdot day$ or less. The temperature and humidity conditions for measuring the water vapor transmission rate are 40° C. and a relative humidity of 90%. In addition, before measuring the water vapor transmission rate, a sample for measurement is exposed to an atmosphere having a temperature of 23° C.±5° C. and a relative humidity of 40% or more and 65% or less for 30 minutes or more.

The water vapor transmission rate can be measured, for example, using a water vapor transmission rate measuring apparatus (trade name: PERMATRAN) manufactured by MOCON, Inc.

<<Oxygen Transmission Rate>>

The barrier film preferably has a value of oxygen transmission rate according to JIS K7126-2:2006 of 0.5 $cc/m^2 \cdot day \cdot atm$ or less. The temperature and humidity conditions for measuring the oxygen transmission rate are 23° C. and a relative humidity of 90%. In addition, before measuring the oxygen transmission rate, a sample for measurement is exposed to an atmosphere having a temperature of 23° C.±5° C. and a relative humidity of 40% or more and 65% or less for 30 minutes or more.

The oxygen transmission rate can be measured, for example, using an oxygen transmission rate measuring apparatus (trade name: OX-TRAN) manufactured by MOCON, Inc (MOCON method).

<<b* Value>>

The barrier film has a b* value in the L*a*b* color system of preferably −1.3 or more and 1.0 or less, more preferably −1.5 or more and 0.8 or less, and further preferably −1.0 or more and 0.5 or less. The b* value is a b* value for transmission. The light coming-in surface when measuring the b* value is the surface of the opposite side from the light-transmitting base material.

The L*a*b* color system is based on the L*a*b* color system standardized by the International Commission on Illumination (CIE) in 1976 and is adopted in JIS Z8781-4: 2013.

<<Total Light Transmittance>>

The barrier film has a total light transmittance according to JIS K7361-1:1997 of preferably 80% or more, more preferably 85% or more, and further preferably 87% or more. The light coming-in surface when measuring the total light transmittance is the surface of the opposite side from the light-transmitting base material.

<Laminated Configuration>

Examples of the laminated configuration of the barrier film of the present disclosure include the following (1). In the following (1), "/" means the interface between layers.
(1) Light-transmitting base material/inorganic oxide layer A/organic coating layer B/inorganic oxide layer C/primer layer D The barrier film may have a layer other than the above as long as the layer does not impair the effects of the present disclosure.

Examples of the laminated configuration of the barrier film of the present disclosure also include the laminated configuration of the following (2). However, the laminated configuration of the following (2) is disadvantageous in terms of an optical property because the number of interfaces is larger than that of the above (1), and the total thickness is also increased. Accordingly, the laminated configuration of the above (1) is preferable.
(2) First light-transmitting base material/inorganic oxide layer A/organic coating layer B/inorganic oxide layer C/second light-transmitting base material/primer layer D <Production Method>

The barrier film can be produced, for example, by forming the inorganic oxide layer A, the organic coating layer B, the inorganic oxide layer C, and the primer layer D in presented order on the light-transmitting base material.

As described above, the inorganic oxide layer A and the inorganic oxide layer C can be formed by a physical vapor deposition method such as a vacuum vapor deposition method, a chemical vapor deposition method such as a plasma chemical vapor deposition method, or the like.

The organic coating layer B and the primer layer D can each be formed by applying, drying, and as necessary curing a coating liquid in which a composition for constituting the layer is dissolved or dispersed.

<Applications>

The barrier film for a wavelength conversion sheet according to the present disclosure can be used, for example, as a barrier film for a wavelength conversion sheet of a surface light source. Examples of the surface light source include a backlight light source of a liquid crystal display device and a backlight light source of an inspection device. That is, the barrier film for a wavelength conversion sheet according to the present disclosure can be used as a "barrier film for a wavelength conversion sheet of a backlight light source of a liquid crystal display device," a "barrier film for a wavelength conversion sheet of a backlight light source of an inspection device," or the like.

Further, the barrier film for a wavelength conversion sheet according to the present disclosure can also be used as a "barrier film for a wavelength conversion sheet for horticulture." Examples of the wavelength conversion sheet for horticulture include a sheet having the function of converting an ultraviolet ray into a wavelength suitable for plant growth. Examples of the wavelength suitable for plant growth include a wavelength suitable for photosynthesis. The wavelength conversion sheet for horticulture can be installed, for example, on a ceiling or the like of a horticultural facility such as a plastic greenhouse and a glasshouse.

[Wavelength Conversion Sheet]

The wavelength conversion sheet of the present disclosure is a wavelength conversion sheet including a quantum dot-containing layer including a quantum dot and barrier films respectively laminated on both sides of the quantum dot-containing layer, wherein the barrier film is the barrier film of the present disclosure described above and is laminated such that the surface of the opposite side of the barrier film from the light-transmitting base material faces a side of the quantum dot-containing layer.

FIG. 2 is a cross-sectional view showing an embodiment of a wavelength conversion sheet (200) of the present disclosure. The wavelength conversion sheet (200) of FIG. 2 has a quantum dot-containing layer (50) including a quantum dot and barrier films (100a, 100b) laminated on both sides, respectively, of the quantum dot-containing layer. In addition, in the wavelength conversion sheet (200) of FIG. 2, the barrier films are laminated such that the surface of the opposite side of each of the barrier films (100a, 100b) from a light-transmitting base material (10) faces the side of the quantum dot-containing layer (50).

As shown in FIG. 2 the wavelength conversion sheet preferably has a vertically symmetrical configuration centered on the quantum dot-containing layer. In other words, it is preferable to use barrier films having the same configuration as the barrier films respectively laminated on both sides of the quantum dot-containing layer. Due to the above configuration, the strain can be evenly dispersed so that the flatness of the wavelength conversion sheet can be easily improved, and the close adhesion of each interface of the wavelength conversion sheet can also be easily improved.

<Quantum Dot-containing Layer>

The quantum dot-containing layer includes a quantum dot and a binder resin.

The quantum dot is a nanometer-sized file particle of a semiconductor, exhibits a specific optical or electrical nature due to the quantum confinement effect (quantum size effect), the effect of confining an electron or an exciton in a small nanometer-sized crystal, and is also referred to as a semiconductor nanoparticle or a semiconductor nanocrystal.

The quantum dot is not particularly limited as long as it is a nanometer-sized fine particle of a semiconductor and is a material that generates the quantum confinement effect (quantum size effect). Examples of the quantum dot include a semiconductor fine particle whose emission color is regulated by its own particle size and a semiconductor fine particle having a dopant.

Quantum dots have different emission colors depending on the particle sizes thereof, and for example, in the case of quantum dots constituted only by a core made of CdSe, the peak wavelengths of fluorescence spectra when the particle sizes are 2.3 nm, 3.0 nm, 3.8 nm, and 4.6 nm are 528 nm, 570 nm, 592 nm, and 637 nm, respectively. That is, the particle size of the quantum dot that emits secondary light having a peak wavelength of 637 nm is 4.6 nm, and the particle size of the quantum dot that emits secondary light having a peak wavelength of 528 nm is 2.3 nm.

The quantum dots preferably include one or more selected from the group consisting of a quantum dot that emits secondary light having a wavelength corresponding to red and a quantum dot that emits secondary light having a wavelength corresponding to green, and more preferably include a quantum dot that emits secondary light having a wavelength corresponding to red and a quantum dot that emits secondary light having a wavelength corresponding to green.

The quantum dots may contain a quantum dot other than the quantum dot that emits secondary light having a wavelength corresponding to red or the quantum dot that emits secondary light having a wavelength corresponding to green.

The quantum dot content is appropriately adjusted according to the thickness of the quantum dot-containing layer, the recycling rate of light in the backlight, the target color, or the like. If the thickness of the quantum dot-containing layer is in the range described later, the quantum dot content is about 0.01 parts by mass or more and 1.0 part by mass or less per 100 parts by mass of the binder resin of the quantum dot-containing layer.

Specific examples of a material that forms the core of the quantum dot include a semiconductor crystal containing a semiconductor compound or a semiconductor such as a group II-VI semiconductor compound such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, a group III-V semiconductor compound such as AlN, AlP, AlAs, AlSb, GaAs, GaP, GaN, GaSb, InN, InAs, InP, InSb, TiN, TiP, TiAs, and TiSb, or a group IV semiconductor such as Si, Ge, and Pb. A semiconductor crystal including a semiconductor compound including three or more elements such as InGaP can also be used.

Further, as a quantum dot composed of a semiconductor fine particle having a dopant, a semiconductor crystal can be used that is formed by doping the above semiconductor compound with a cation of a rare earth metal or a cation of a transition metal, such as $Eu^{3+}$, $Tb^{3+}$, $Ag^+$, or $Cu^+$.

A semiconductor crystal such as CdS, CdSe, CdTe, InP, or InGaP is suitable as a material that forms the core of the quantum dot in view of ease of preparation, controllability of particle size that can provide light emission in the visible range, and fluorescence quantum yield.

The quantum dot may be made of one semiconductor compound or two or more semiconductor compounds, and for example, may have a core-shell type structure having a core made of a semiconductor compound and a shell made of a semiconductor compound different from that of the core.

When the core-shell type quantum dot is used, a material having a bandgap higher than that of the semiconductor compound that forms the core can be used as the semiconductor that forms the shell so that an exciton is confined in the core, whereby the light emission efficiency of the quantum dot can be enhanced.

Examples of the core-shell structure (core/shell) having such a bandgap magnitude relationship include CdSe/ZnS, CdSe/ZnSe, CdSe/CdS, CdTe/CdS, InP/ZnS, Gap/ZnS, Si/ZnS, InN/GaN, InP/CdSSe, InP/ZnSeTe, InGaP/ZnSe, InGaP/ZnS, Si/AlP, InP/ZnSTe, InGaP/ZnSTe, and InGaP/ZnSSe.

The size of the quantum dot may be appropriately controlled by the material that constitutes the quantum dot so that light having a desired wavelength can be obtained. As the particle size of the quantum dot decreases, the energy bandgap increases. Specifically, as the crystal size decreases, the light emission of the quantum dot shifts to the blue side, that is, to the high energy side. Accordingly, by changing the size of the quantum dot, the emission wavelength thereof can be regulated over the entire spectral wavelength region of the ultraviolet region, the visible region, and the infrared region.

In general, the particle size (diameter) of the quantum dot is preferably in the range of 0.5 nm or more and 20 nm or less and particularly preferably in the range of 1 nm or more and 10 nm or less. A narrower size distribution of the quantum dot can provide a clearer emission color.

The shape of the quantum dot is not particularly limited, and may be, for example, a spherical shape, a rod shape, a disk shape, or any other shape.

When the particle dot is not in a spherical shape, the particle size of the quantum dot can be a value of a truly spherical shape having the same volume.

The quantum dot may be coated with a resin.

Examples of the binder resin of the quantum dot-containing layer include a thermoplastic resin, a cured product of a thermosetting resin composition, and a cured product of an ionizing radiation curable resin composition. Among these, in view of durability, a cured product of a thermosetting resin composition and a cured product of an ionizing radiation curable resin composition are preferable, and a cured product of an ionizing radiation curable resin composition is more preferable.

The thermosetting resin composition is a composition including at least a thermosetting resin, and is a resin composition that is cured by heating. The thermosetting resin composition includes preferably a thiol compound and more preferably a polyfunctional thiol compound, which are described later, in addition to the thermosetting resin.

Examples of the thermosetting resin include an acrylic resin, a urethane resin, a phenol resin, a urea melamine resin, an epoxy resin, an unsaturated polyester resin, and a silicone resin. In the thermosetting resin composition, a curing agent is added, as necessary, to these curable resins.

The ionizing radiation curable resin composition is a composition including a compound having an ionizing radiation curable functional group (hereinafter, also referred to as an "ionizing radiation curable compound"). The ionizing radiation curable resin composition includes preferably a thiol compound and more preferably a polyfunctional thiol compound, which are described later, in addition to the ionizing radiation curable compound.

Examples of the ionizing radiation curable functional group include an ethylenically unsaturated bond group such as a (meth)acryloyl group, a vinyl group, or an allyl group, an epoxy group, and an oxetanyl group, and among these, an ethylenically unsaturated bond group is preferable. Among the ethylenically unsaturated bond groups, a (meth)acrylate group is preferable. Hereinafter, the ionizing radiation curable compound having a (meth)acryloyl group is referred to as a (meth)acrylate-based compound. That is, the binder resin preferably includes a cured product of a composition including a (meth)acrylate-based compound.

As used herein, "(meth)acrylate" refers to methacrylate and acrylate. As used herein, "ionizing radiation" means an electromagnetic wave or a charged particle beam having an energy quantum that can polymerize or crosslink a molecule among electromagnetic waves or charged particle beams, and usually, an ultraviolet ray or an electron beam is used. An electromagnetic wave such as an X-ray or a γ-ray, and a charged particle beam such as an α-ray or an ion beam can also be used.

The ionizing radiation curable compound may be a monofunctional ionizing radiation curable compound having only one such functional group, a polyfunctional ionizing radiation curable compound having two or more such functional groups, or a mixture thereof. Among these, a polyfunctional ionizing radiation curable compound is preferable, and a polyfunctional (meth)acrylate-based compound having two or more (meth)acryloyl groups is more preferable. That is, the binder resin includes preferably a cured product of a polyfunctional ionizing radiation curable compound and more preferably a cured product of a polyfunctional (meth)acrylate-based compound. Further, the binder resin includes preferably a cured product of a composition including a polyfunctional ionizing radiation curable compound and a thiol compound and more preferably a cured product of a composition including a polyfunctional (meth)acrylate-based compound and a thiol compound.

The polyfunctional (meth)acrylate-based compound may have an alkyleneoxy group.

As the alkyleneoxy group, for example, an alkyleneoxy group having 2 or more and 4 or less carbon atoms is preferable, an alkyleneoxy group having 2 or 3 carbon atoms is more preferable, and an alkyleneoxy group having 2 carbon atoms is further preferable.

The polyfunctional (meth)acrylate-based compound having an alkyleneoxy group may be a polyfunctional (meth)acrylate-based compound having a polyalkyleneoxy group including a plurality of alkyleneoxy groups.

When the polyfunctional (meth)acrylate-based compound has an alkyleneoxy group, the number of alkyleneoxy groups in one molecule is preferably 2 or more and 30 or less, and more preferably 2 or more and 20 or less, further preferably 3 or more and 10 or less, and more further preferably 3 or more and 5 or less.

When the polyfunctional (meth)acrylate-based compound has an alkyleneoxy group, the compound preferably has a bisphenol structure. This tends to improve the heat resistance of the cured product. Examples of the bisphenol structure include a bisphenol A structure and a bisphenol F structure, and among these, a bisphenol A structure is preferable.

As the polyfunctional (meth)acrylate-based compound having an alkyleneoxy group, above all, ethoxylated bisphenol A type di(meth)acrylate, propoxylated bisphenol A type di(meth)acrylate, and propoxylated ethoxylated bisphenol A type di(meth)acrylate are preferable, and ethoxylated bisphenol A type di(meth)acrylate is more preferable.

The ionizing radiation curable compound may be a monomer, an oligomer, a low molecular weight polymer, or a mixture thereof.

As described above, the thermosetting resin composition and the ionizing radiation curable resin composition preferably include a thiol compound.

The thiol compound is a compound having one or more units represented by R—SH wherein R is an organic group. As used herein, a compound having one unit represented by R—SH is referred to as a monofunctional thiol compound, and a compound having two or more units represented by R—SH is referred to as a polyfunctional thiol compound.

The thiol compound may be a monofunctional thiol compound, but a polyfunctional thiol compound is preferable in view of improving the strength of the quantum dot-containing layer. Among the polyfunctional thiol compounds, a trifunctional thiol compound or a tetrafunctional thiol compound is more preferable.

The thiol compound causes a thiol-ene reaction of the following equation with a compound having a radically polymerizable functional group in the presence of a radical polymerization initiator. The thiol-ene reaction is preferable in the following: because the thiol-ene reaction can suppress polymerization shrinkage, the stress generated at the time of curing the quantum dot-containing layer is relaxed, and as a result, the interlayer close adhesion of the wavelength conversion sheet is easily further improved. In addition, the cured product obtained by the thiol-ene reaction is preferable in that the heat resistance is easily improved. Further, the refractive index of the thiol compound (about 1.53) is higher than the refractive index of the polyfunctional (meth) acrylate-based compound (about 1.45), and thus the degree of freedom in adjusting the refractive index of the quantum dot-containing layer can be increased.

The following reaction is an example of a reaction between a monofunctional thiol compound and a compound having one radically polymerizable functional group. It is considered that the reaction product of a polyfunctional thiol compound and a compound having two or more radically polymerizable functional groups easily forms a dendrimer structure. Then, it is considered that when the dendrimer structure is formed, the flexibility of the quantum dot-containing layer increases, and that the quantum dot-containing layer itself easily exerts an excellent stress relaxation property. Examples of the radically polymerizable functional group include an ethylenically unsaturated bond-containing group such as a (meth)acryloyl group, a vinyl group, or an allyl group.

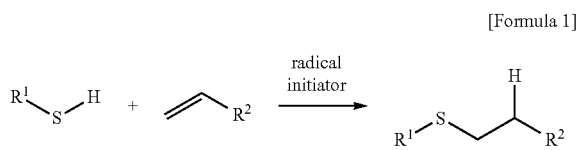

[Formula 1]

wherein $R^1$ and $R^2$ are organic groups.

Specific examples of the monofunctional thiol compound include hexanethiol, 1-heptanethiol, 1-octanethiol, 1-nonanethiol, 1-decanethiol, 3-mercaptopropionic acid, methyl mercaptopropionate, methoxybutyl mercaptopropionate, octyl mercaptopropionate, tridecyl mercaptopropionate, 2-ethylhexyl-3-mercaptopropionate, and n-octyl-3-mercaptopropionate.

Specific examples of the polyfunctional thiol compound include ethylene glycol bis(3-mercaptopropionate), diethylene glycol bis(3-mercaptopropionate), tetraethylene glycol bis(3-mercaptopropionate), 1,2-propylene glycol bis(3-mercaptopropionate), diethylene glycol bis(3-mercaptobutyrate), 1,4-butanediol bis(3-mercaptopropionate), 1,4-butanediol bis(3-mercaptobutyrate), 1,8-octanediol bis(3-mercaptopropionate), 1,8-octanediol bis(3-mercaptobutyrate), hexanediol bisthioglycolate, trimethylolpropane tris(3-mercaptopropionate), trimethylolpropane tris(3-mercaptobutyrate), trimethylolpropane tris(3-mercaptoisobutyrate), trimethylolpropane tris(2-mercaptoisobutyrate), trimethylolpropane tristhioglycolate, tris-[(3-mercaptopropionyloxy)-ethyl]-isocyanurate, trimethylolethane tris(3-mercaptobutyrate), pentaerythritol tetrakis(3-mercaptopropionate), pentaerythritol tetrakis(3-mercaptobutyrate), pentaerythritol tetrakis(3-mercaptoisobutyrate), pentaerythritol tetrakis(2-mercaptoisobutyrate), dipentaerythritol hexakis(3-mercaptopropionate), dipentaerythritol hexakis(2-mercaptopropionate), dipentaerythritol hexakis(3-mercaptobutyrate), dipentaerythritol hexakis(3-mercaptoisobutyrate), dipentaerythritol hexakis(2-mercaptoisobutyrate), pentaerythritol tetrakisthioglycolate, and dipentaerythritol hexakisthioglycolate.

In the ionizing radiation curable resin composition (or thermosetting resin composition), the mass ratio of the ionizing radiation curable compound (or thermosetting resin) to the thiol compound is preferably 80:20 to 35:65 and more preferably 70:30 to 40:60.

When the ionizing radiation curable compound is an ultraviolet curable compound, the ionizing radiation curable composition preferably includes an additive such as a photopolymerization initiator or a photopolymerization accelerator.

The quantum dot-containing layer may include an internal diffusion particle.

As the internal diffusion particle, either of an organic particle and an inorganic particle can be used. Examples of the organic particle include a particle made of polymethyl methacrylate, an acrylic-styrene copolymer, a melamine resin, a polycarbonate, a polystyrene, polyvinyl chloride, a benzoguanamine-melamine-formaldehyde condensate, a silicone resin, a fluororesin, a polyester, or the like. Examples of the inorganic fine particle include a fine particle made of silica, alumina, zirconia, titania, or the like.

Examples of the shape of the internal diffusion particle include a spherical shape, a disk shape, a rugby ball shape, and an irregular shape. The internal diffusion particle may be any of a hollow particle, a porous particle, and a solid particle.

The content of the internal diffusion particle is preferably 1 part by mass or more and 40 parts by mass or less and more preferably 3 parts by mass or more and 30 parts by mass or less per 100 parts by mass of the binder resin.

The average particle size of the internal diffusion particle is preferably 1 μm or more and 7 μm or less and more preferably 1 μm or more and 3 μm or less.

The thickness of the quantum dot-containing layer is preferably 10 μm or more and 200 μm or less, more preferably 20 μm or more and 150 μm or less, and further preferably 30 μm or more and 130 μm or less.

The refractive index $n_Z$ of the quantum dot-containing layer is preferably 1.40 or more and 1.55 or less, more preferably 1.43 or more and 1.52 or less, and further preferably 1.46 or more and 1.50 or less.

The refractive index $n_Z$ of the quantum dot-containing layer is mostly governed by the refractive index of the binder resin. The reason for this is as follows: the quantum dot-containing layer has a low quantum dot content, and even if an internal diffusion agent is contained, the internal diffusion agent has a particle size larger than the wavelength of light and does not affect the refractive index of the layer.

[Backlight]

The backlight of the present disclosure is a backlight including: at least one light source that emits primary light; an optical plate that is disposed adjacent to the light source and is for light guiding or diffusion; and a wavelength conversion sheet disposed on a light going-out side of the optical plate, wherein the wavelength conversion sheet is the wavelength conversion sheet of the present disclosure described above.

Examples of a backlight 300 of the present disclosure include an edge-lit type backlight 301 as shown in FIG. 3 and a direct-lit type backlight 302 as shown in FIG. 4.

An optical plate 220 used for the edge-lit type backlight 301 in FIG. 3 is an optical member for guiding primary light emitted by a light source 210, and is a so-called light guide plate 221. The light guide plate 221 has, for example, a substantially flat plate shape configured to have at least one surface as a light coming-in surface and one surface substantially orthogonal to the light coming-in surface as a light going-out surface.

The light guide plate is mainly made of a matrix resin selected from the group consisting of a highly transparent resin such as polymethyl methacrylate. A resin particle having a refractive index different from that of the matrix resin may be added, as necessary, to the light guide plate. Each surface of the light guide plate may have a complicated surface shape instead of a uniform flat surface, and may be provided with a dot pattern or the like.

The optical plate 220 used for the direct-lit type backlight 302 of FIG. 4 is an optical member (light diffusing plate 222) having a light diffusing property for making the pattern of the light source 210 less visible. Examples of the light diffusing plate 222 include a milky white resin plate having a thickness of about 1 mm or more and 3 mm or less.

In addition to the light source, the optical plate, and the barrier film described above, the edge-lit type and direct-lit type backlights may include one or more members selected from the group consisting of a reflector, a light diffusing film, a prism sheet, a brightness enhancement film (BEF), a reflective polarizing film (DBEF), and the like, depending on the purpose.

The reflector is disposed on the opposite side of the optical plate from the light going-out surface side. The light diffusing film, the prism sheet, the brightness enhancement film, and the reflective polarizing film are disposed on the light going-out surface side of the optical plate. A backlight having an excellent balance of front brightness, viewing angle, and the like can be provided when the backlight is configured to include one or more members selected from the group consisting of a reflector, a light diffusing film, a prism sheet, a brightness enhancement film, a reflective polarizing film, and the like.

In the edge-lit type and direct-lit type backlights, the light source 210 is a light emitting body that emits primary light, and it is preferable to use a light emitting body that emits primary light having a wavelength corresponding to blue. The primary light having a wavelength corresponding to blue preferably has a peak wavelength in the range of 380 nm or more and 480 nm or less. The peak wavelength is more preferably 450 nm±7 nm, more preferably 450 nm±5 nm, more preferably 450 nm±3 nm, and more preferably 450 nm±1 nm.

The light source 210 is preferably an LED light source and more preferably a blue monochromatic LED light source, in view of simplifying and downsizing the apparatus in which the backlight is installed. The number of the light source 210 is at least one, and it is preferable to provide a plurality thereof in view of emitting sufficient primary light.

In the backlight including the wavelength conversion sheet, the difference in x value (Δx) and the difference in y value (Δy) between before and after the following high temperature and high humidity test in the Yxy color system of the International Commission on Illumination (CIE) are each preferably 0.015 or less and more preferably 0.010 or less. By setting each of Δx and Δy to 0.020 or less, the change in color can be suppressed.

High temperature and high humidity test: A test involving exposure to an atmosphere having 60° C. and a relative humidity of 90% for 1000 hours.

The x and y values after the high temperature and high humidity test are measured in an atmosphere having a temperature of 23° C.±5° C. and a relative humidity of 40% or more and 65% or less immediately after the measurement sample is taken out from the environment of the high temperature and high humidity test.

[Liquid Crystal Display Device]

The liquid crystal display device of the present disclosure is a liquid crystal display device including a backlight and a liquid crystal panel, wherein the backlight is the backlight of the present disclosure described above.

The liquid crystal panel is not particularly limited, and a general-purpose liquid crystal panel can be used as the liquid crystal panel of the liquid crystal display device. For example, a liquid crystal panel having a general structure can be used in which the liquid crystal layer is sandwiched between glass plates on the upper side and the lower side, respectively, thereof, specifically, a liquid crystal panel using a display mode such as TN, STN, VA, IPS, and OCB.

The liquid crystal display device further includes a polarizing plate, a color filter, and the like. A general-purpose polarizing plate and color filter can be used.

The display image of the liquid crystal display device is displayed in color by the white light emitted from the backlight penetrating the color filter. The liquid crystal display device, in which a color filter that matches the spectrum of a backlight using a quantum dot is used, can realize a display that is excellent in brightness and efficiency and produces a very clear color.

EXAMPLES

Next, the present disclosure will be described in more detail with reference to Examples, but the present disclosure is not limited to these Examples at all. "Parts" and "%" are by mass unless otherwise specified.

1. Measurements and Evaluations

The following measurements and evaluations of the barrier films or wavelength conversion sheets of Examples and Comparative Examples were carried out. Results thereof are shown in Tables 1 and 2.

1-1. Water Vapor Transmission Rate

A value of the water vapor transmission rate according to JIS K7129-2:2019 of each of the barrier films of the Examples and the Comparative Examples was measured. As the measuring apparatus, the trade name "PERMATRAN" manufactured by MOCON, Inc. was used. The temperature and humidity conditions for measuring the water vapor transmission rate were 40° C. and a relative humidity of 90%. Before measuring the water vapor transmission rate, a sample for measurement was exposed to an atmosphere having a temperature of 23° C.±5° C. and a relative humidity of 40% or more and 65% or less for 30 minutes or more. The water vapor transmission rate thus measured means the water vapor transmission rate in the initial stage. A sample having a water vapor transmission rate of 0.20 g/m²·day or less is at an acceptable level.

1-2. Total Light Transmittance

The total light transmittance of each of the barrier films of the Examples and the Comparative Examples was measured. The light coming-in surface was the surface of the opposite side from the light-transmitting base material. As the measuring apparatus, a haze meter (HM-150, manufactured by Murakami Color Research Laboratory Co., Ltd.) was used. A sample having a total light transmittance of 85% or more is at an acceptable level.

The total light transmittance was measured in an atmosphere having a temperature of 23° C.±5° C. and a relative humidity of 40% or more and 65% or less. Each sample was exposed to the atmosphere for 30 minutes or more before the measurement. The total light transmittance thus measured means the total light transmittance in the initial stage.

1-3. b* Value

The b* value (b* value for transmission) of the L*a*b* color system of each of the barrier films of the Examples and the Comparative Examples was measured. The light coming-in surface was the surface of the opposite side from the light-transmitting base material. As the measuring apparatus, a spectrophotometer (trade name: V670) manufactured by JASCO Corporation was used. A sample having a b* value of −1.3 or more and 1.0 or less is at an acceptable level.

The b* value was measured in an atmosphere having a temperature of 23° C.±5° C. and a relative humidity of 40% or more and 65% or less. Each sample was exposed to the atmosphere for 30 minutes or more before the measurement. The b* value thus measured means the b* value in the initial stage.

1-4. Δx and Δy

<Provision of Direct-lit Type Backlight for Measurement>

A commercially available liquid crystal display television (manufactured by VIZIO, Inc., PQ65-F1) equipped with a direct-lit type backlight was disassembled, and the direct-lit type backlight was taken out. The direct-lit type backlight is equipped with a direct-lit type blue LED having an emission central wavelength of 450 nm and a full width at half maximum of 20 nm as a light source. In addition, on the light going-out side of the light source, a light diffusing plate, a wavelength conversion sheet including a quantum dot-containing layer, a prism sheet, and a reflective polarizing plate (brightness enhancement film, manufactured by 3M, DBEF (registered trademark)) are disposed in presented order. In addition, a reflective sheet is provided on the opposite side of the light source from the light going-out side.

The wavelength conversion sheet in the direct-lit type backlight was changed to each of the wavelength conversion sheets of the Examples and the Comparative Examples to obtain a "direct-lit type backlight for measurement of an x value and a y value in the initial stage". Each of the wavelength conversion sheets of the Examples and the Comparative Examples was exposed to an atmosphere having a temperature of 23° C.±5° C. and a relative humidity of 40% or more and 65% or less for 30 minutes or more before being incorporated into the direct-lit type backlight.

The wavelength conversion sheet in the direct-lit type backlight was changed to each of the wavelength conversion sheets of the Examples and the Comparative Examples for which a high temperature and high humidity test (a test involving exposure to an atmosphere of 60° C. and a relative humidity of 90% for 1000 hours) had been carried out, to obtain a "direct-lit type backlight for measurement of an x value and a y value after the high temperature and high humidity test." The work of incorporating each of the wavelength conversion sheets of the Examples and the Comparative Examples for which the high temperature and high humidity test had been carried out into the direct-lit type backlight was carried out quickly in an atmosphere having a temperature of 23° C.±5° C. and a relative humidity of 40% or more and 65% or less.

Then, the measurement was carried out for the direct-lit type backlight for measurement described above in the following measurement environment.

<x Value and y Value in Initial Stage>

The direct-lit type backlight for measurement of an x value and a y value in the initial stage was turned on, and an x value and a y value of the Yxy color system of the International Commission on Illumination (CIE) were measured from the front direction 500 mm away therefrom in a dark room environment. The measurement atmosphere was at a temperature of 23° C.±5° C. and a relative humidity of 40% or more and 65% or less. Each sample was exposed to the atmosphere for 30 minutes or more before the measurement. As the measuring apparatus, a spectroradiometer (trade name: SR-3AR) manufactured by Topcon Technohouse Corporation was used.

<x Value and y Value after High Temperature and High Humidity Test>

The direct-lit type backlight for measurement of an x value and a y value after the high temperature and high humidity test was turned on, and an x value and a y value of the Yxy color system of the International Commission on Illumination (CIE) were measured from the front direction 500 mm away therefrom in a dark room environment. The measurement atmosphere was at a temperature of 23° C.±5° C. and a relative humidity of 40% or more and 65% or less. As the measuring apparatus, a spectroradiometer (trade name: SR-3AR) manufactured by Topcon Technohouse Corporation was used.

<Δx and Δy>

The difference between the x value in the initial stage and the x value after the high temperature and high humidity test (Δx) and the difference between the y value in the initial stage and the y value after the high temperature and high humidity test (Δy) were calculated. A sample in which the Δx and the Δy are each 0.015 or less is at an acceptable level.

2. Preparation of Quantum Dot Dispersion Liquid

A quantum dot and amino-modified silicone were mixed at the composition ratio shown below in a glove box purged with nitrogen such that the oxygen concentration was 300 ppm or less, and the resulting mixture was stirred using a magnetic stirrer for 4 hours while heated in a water bath at 90° C. Thereafter, the mixture was filtered through a polypropylene filter having a pore size of 0.2 μm to obtain a CdSe/ZnS core-shell type quantum dot dispersion liquid.

| | |
|---|---|
| Quantum dot (Emission peak: 540 nm, serial number: 748056, manufactured by Sigma-Aldrich Corporation) | 0.9 parts by mass |
| Quantum dot (Emission peak: 630 nm, serial number: 790206, manufactured by Sigma-Aldrich Corporation) | 0.9 parts by mass |
| Amino-modified silicone (Manufactured by Genesee Polymers Corporation, product number: GP-344, viscosity: 670 mPa · s) | 99 parts by mass |

3. Preparation of Barrier Film and Preparation of Wavelength Conversion Sheet

Example 1

Aluminum oxide is vapor-deposited on one surface of a biaxially stretched PET film (refractive index $n_0$: 1.636, thickness $t_0$: 12 μm) by a vacuum vapor deposition method to form an inorganic oxide layer A (refractive index $n_A$: 1.77, thickness $t_A$: 8 nm).

Next, the following coating liquid for organic coating layer formation was applied onto the inorganic oxide layer A by gravure printing and heat-treated at 180° C. for 60 seconds to form an organic coating layer B (refractive index $n_B$: 1.55, thickness $t_B$: 219 nm).

Next, aluminum oxide was vapor-deposited on the organic coating layer B by a vacuum vapor deposition method to form an inorganic oxide layer C (refractive index $n_C$: 1.77, thickness $t_C$: 8 nm).

Next, the following coating liquid 1 for primer layer formation was applied onto the inorganic oxide layer C by gravure printing and heat-treated at 80° C. for 60 seconds to form a primer layer D (refractive index $n_D$: 1.575, thickness $t_E$: 270 nm), thereby obtaining the barrier film of Example 1. Two barrier films having the same configuration were prepared.

<Preparation of Coating Liquid for Organic Coating Layer Formation>

Tetraethoxysilane was mixed into a solution (pH 2.2) obtained by mixing water, isopropyl alcohol, and 0.5 N hydrochloric acid, while cooling the solution to 10° C., to thereby prepare solution A. Separately, polyvinyl alcohol and isopropyl alcohol having a saponification value of 99% or more were mixed to thereby prepare solution B. Solution A and solution B were mixed to prepare a coating liquid for organic coating layer formation (solid content: 5% by mass). The mass ratio of tetraethoxysilane to polyvinyl alcohol in the coating liquid for organic coating layer formation is 29:4.

| <Coating liquid 1 for primer layer formation> | |
|---|---|
| Polyester polyurethane polyol (Hydroxyl value: 62 mgKOH/g, solid content: 20% by mass) | 50 parts by mass |
| Silane coupling agent (3-Glycidoxypropylmethyldimethoxysilane) | 1 part by mass |
| Silica filler (Average particle size 5 μm) | 1 part by mass |
| Curing agent (1,6-Hexamethylene diisocyanate, solid content 35%) | 1 part by mass |
| Solvent (Methyl ethyl ketone) | 50 parts by mass |

A coating liquid for a quantum dot-containing layer having the following formulation was applied onto the surface of the primer layer side of one of the two barrier films prepared above and dried to form a quantum dot-containing layer not irradiated with ionizing radiation, thereby obtaining a laminated body A.

Next, the laminated body A and the other barrier film were laminated such that the surface of the side of the quantum dot-containing layer not irradiated with ionizing radiation of the laminated body A and the surface of the primer layer side of the other barrier film face each other, and then irradiated with an ultraviolet ray to allow the curing of the ionizing radiation curable resin composition of the quantum dot-containing layer to proceed, thereby obtaining a wavelength conversion sheet of Example 1. The thickness of the quantum dot-containing layer is 100 μm, and the refractive index is 1.48.

| <Coating liquid for quantum dot-containing layer> | |
|---|---|
| Polyfunctional acrylate-based compound (Ethoxylated bisphenol A diacrylate; trade name "ABE-300" of Shin-Nakamura Chemical Co., Ltd.) | 58.11 parts by mass |
| Polyfunctional thiol compound (Pentaerythritol tetrakis(3-mercaptopropionate); trade name "PEMP" of SC Organic Chemical Co., Ltd.) | 38.74 parts by mass |
| Photopolymerization initiator (Trade name "Omnirad TPO H" of IGM Resins B.V.) | 0.5 parts by mass |
| Quantum dot dispersion liquid prepared in "2" above | 1.61 parts by mass |
| Acetic acid | 0.79 parts by mass |
| Titanium oxide (Trade name "Ti-Pure R-706" of The Chemours company; particle size 0.36 μm) | 0.25 parts by mass |

Examples 2 to 14

Barrier films and wavelength conversion sheets of Examples 2 to 14 were obtained in the same manner as in Example 1 except that the thicknesses of the organic coating layer B and the primer layer D were changed to the values shown in Table 1.

However, the primer layer of each of Examples 9 to 14 was formed from the following coating liquid 2 for primer layer formation. In addition, the refractive index $n_D$ of the primer layer of each of Examples 9 to 14 was 1.58.

| <Coating liquid 2 for primer layer formation> | |
|---|---|
| Polyester polyurethane polyol (Hydroxyl value: 52 mgKOH/g, solid content: 20% by mass) | 50 parts by mass |
| Silane coupling agent (3-Glycidoxypropylmethyldimethoxysilane) | 1 part by mass |
| Silica filler (Average particle size 5 μm) | 1 part by mass |
| Curing agent (1,3-Xylene diisocyanate, solid content: 35%) | 1 part by mass |
| Solvent (Methyl ethyl ketone) | 50 parts by mass |

Examples 15 and 16

Barrier films and wavelength conversion sheets of Examples 15 and 16 were obtained in the same manner as in Example 1 except that the inorganic oxide layer A and the inorganic oxide layer C were each changed to a vapor-deposited film of silicon oxide (refractive index: 1.457), and the thicknesses of the inorganic oxide layer A, the organic coating layer B, the inorganic oxide layer C, and the primer layer D were changed to the values shown in Table 1.

Comparative Example 1

A barrier film and a wavelength conversion sheet of Comparative Example 1 were obtained in the same manner as in Example 1 except that the primer layer D was formed on the organic coating layer B, and the inorganic oxide layer C was not formed.

Comparative Examples 2 to 15

Barrier films and wavelength conversion sheets of Comparative Examples 2 to 15 were obtained in the same manner as in Example 1 except that the thicknesses of the organic coating layer B and the primer layer D were changed to the values shown in Table 2.

However, the primer layer of each of Comparative Examples 12 to 15 was formed from the above coating liquid 2 for primer layer formation. In addition, the refractive index $n_D$ of the primer layer of each of Comparative Examples 12 to 15 was 1.58.

TABLE 1

| | | Examples | | | | | | | |
|---|---|---|---|---|---|---|---|---|---|
| | | 1 | 2 | 3 | 4 | 5 | 6 | 7 | 8 |
| Thickness [nm] | Primer layer D ($T_D$) | 270 | 270 | 270 | 270 | 410 | 130 | 130 | 550 |
| | Inorganic oxide layer C (Tc) | 8 | 8 | 8 | 8 | 8 | 8 | 8 | 8 |

TABLE 1-continued

|  |  | 1 | 2 | 3 | 4 | 5 | 6 | 7 | 8 |
|---|---|---|---|---|---|---|---|---|---|
|  | Organic coating layer B ($T_B$) | 219 | 290 | 365 | 435 | 365 | 219 | 235 | 365 |
|  | Material of inorganic oxide layers A ($T_A$) | 8 | 8 | 8 | 8 | 8 | 8 | 8 | 8 |
| Material of inorganic oxide layers |  | AlOx | AlOx | AlOx | AlOx | AlOx | AlOx | AlOx | AlOx |
| Thickness ratio ($T_D/T_B$) |  | 1.23 | 0.93 | 0.74 | 0.62 | 1.12 | 0.59 | 0.55 | 1.51 |
| Type of primer layer coating liquid [1 or 2] |  | 1 | 1 | 1 | 1 | 1 | 1 | 1 | 1 |
| Measurements and evaluations | Water vapor transmission rate [g/m² · day] | 0.10 | 0.10 | 0.10 | 0.10 | 0.10 | 0.10 | 0.10 | 0.10 |
|  | Total light transmittance [%] | 90.1 | 89.6 | 90.4 | 89.8 | 89.7 | 90.0 | 90.1 | 89.8 |
|  | b* value | −0.7 | −0.1 | −0.3 | −0.1 | −0.6 | −1.0 | −0.9 | −0.3 |
|  | Δx | −0.005 | −0.004 | −0.003 | −0.003 | −0.004 | −0.005 | −0.004 | −0.005 |
|  | Δy | −0.009 | −0.006 | −0.007 | −0.004 | −0.007 | −0.008 | −0.006 | −0.008 |

|  |  | Examples |  |  |  |  |  |  |  |
|---|---|---|---|---|---|---|---|---|---|
|  |  | 9 | 10 | 11 | 12 | 13 | 14 | 15 | 16 |
| Thickness [nm] | Primer layer D ($T_D$) | 270 | 130 | 270 | 270 | 270 | 410 | 330 | 330 |
|  | Inorganic oxide layer C (Tc) | 8 | 8 | 8 | 8 | 8 | 8 | 35 | 150 |
|  | Organic coating layer B ($T_B$) | 219 | 235 | 290 | 365 | 435 | 365 | 220 | 330 |
|  | Material of inorganic oxide layers A ($T_A$) | 8 | 8 | 8 | 8 | 8 | 8 | 35 | 150 |
| Material of inorganic oxide layers |  | AlOx | AlOx | AlOx | AlOx | AlOx | AlOx | SiOx | SiOx |
| Thickness ratio ($T_D/T_B$) |  | 1.23 | 0.55 | 0.93 | 0.74 | 0.62 | 1.12 | 1.50 | 1.00 |
| Type of primer layer coating liquid [1 or 2] |  | 2 | 2 | 2 | 2 | 2 | 2 | 1 | 1 |
| Measurements and evaluations | Water vapor transmission rate [g/m² · day] | 0.10 | 0.10 | 0.10 | 0.10 | 0.10 | 0.10 | 0.10 | 0.10 |
|  | Total light transmittance [%] | 88.7 | 88.7 | 88.2 | 89.0 | 88.4 | 88.3 | 88.3 | 88.6 |
|  | b* value | −0.7 | −0.9 | −0.1 | −0.4 | −0.2 | −0.6 | −0.3 | 0.9 |
|  | Δx | −0.005 | −0.004 | −0.004 | −0.003 | −0.003 | −0.004 | 0.001 | 0.000 |
|  | Δy | −0.009 | −0.006 | −0.006 | −0.007 | −0.005 | −0.007 | −0.007 | −0.001 |

TABLE 2

|  |  | Comparative Examples |  |  |  |  |  |  |  |
|---|---|---|---|---|---|---|---|---|---|
|  |  | 1 | 2 | 3 | 4 | 5 | 6 | 7 | 8 |
| Thickness [nm] | Primer layer D ($T_D$) | 270 | 270 | 270 | 270 | 270 | 270 | 270 | 130 |
|  | Inorganic oxide layer C (Tc) | — | 8 | 8 | 8 | 8 | 15 | 20 | 8 |
|  | Organic coating layer B ($T_B$) | 300 | 73 | 145 | 511 | 581 | 500 | 500 | 365 |
|  | Material of inorganic oxide layers A ($T_A$) | 8 | 8 | 8 | 8 | 8 | 15 | 20 | 8 |
| Material of inorganic oxide layers |  | AlOx | AlOx | AlOx | AlOx | AlOx | AlOx | AlOx | AlOx |
| Thickness ratio ($T_D/T_B$) |  | 0.90 | 3.70 | 1.86 | 0.53 | 0.47 | 0.54 | 0.54 | 0.36 |
| Type of primer layer coating liquid [1 or 2] |  | 1 | 1 | 1 | 1 | 1 | 1 | 1 | 1 |
| Measurements and evaluations | Water vapor transmission rate [g/m² · day] | 0.50 | 1.00 | 0.20 | 0.10 | 12.00 | 0.10 | 0.10 | 0.10 |
|  | Total light transmittance [%] | 89.5 | 89.2 | 90.3 | 90.1 | 90.0 | 90.2 | 90.4 | 90.7 |
|  | b* value | 0.1 | −1.5 | 0.6 | −0.4 | −0.1 | −0.3 | 0.0 | −0.3 |
|  | Δx | −0.018 | −0.164 | −0.010 | −0.162 | −0.165 | −0.161 | −0.161 | −0.166 |
|  | Δy | −0.030 | −0.288 | −0.018 | −0.292 | −0.292 | −0.293 | −0.293 | −0.290 |

|  |  | Comparative Examples |  |  |  |  |  |  |
|---|---|---|---|---|---|---|---|---|
|  |  | 9 | 10 | 11 | 12 | 13 | 14 | 15 |
| Thickness [nm] | Primer layer D ($T_D$) | 130 | 410 | 550 | 270 | 270 | 270 | 410 |
|  | Inorganic oxide layer C (Tc) | 8 | 8 | 8 | 8 | 8 | 8 | 8 |
|  | Organic coating layer B ($T_B$) | 511 | 180 | 219 | 73 | 145 | 511 | 180 |
|  | Material of inorganic oxide layers A ($T_A$) | 8 | 8 | 8 | 8 | 8 | 8 | 8 |

TABLE 2-continued

|  |  |  |  |  |  |  |  |  |
|---|---|---|---|---|---|---|---|---|
| Material of inorganic oxide layers | | AlOx | AlOx | AlOx | AlOx | AlOx | AlOx | AlOx |
| Thickness ratio ($T_D/T_B$) | | 0.25 | 2.28 | 2.51 | 3.70 | 1.86 | 0.53 | 2.28 |
| Type of primer layer coating liquid [1 or 2] | | 1 | 1 | 1 | 2 | 2 | 2 | 2 |
| Measurements and evaluations | Water vapor transmission rate [g/m² · day] | 0.10 | 0.15 | 0.10 | 1.00 | 0.20 | 0.10 | 0.15 |
| | Total light transmittance [%] | 91.0 | 89.7 | 90.0 | 87.8 | 88.9 | 88.7 | 88.4 |
| | b* value | 0.1 | −0.2 | −0.3 | −1.6 | 0.5 | −0.4 | −0.2 |
| | Δx | −0.164 | −0.161 | −0.164 | −0.164 | −0.010 | −0.162 | −0.161 |
| | Δy | −0.291 | −0.280 | −0.291 | −0.288 | −0.018 | −0.292 | −0.280 |

As is clear from the results in Table 1 and Table 2, it can be confirmed that the barrier films of the Examples can suppress a change in color when applied to a wavelength conversion sheet.

On the other hand, it can be confirmed that the barrier films of the Comparative Examples cannot suppress a change in color when applied to a wavelength conversion sheet. The barrier film of Comparative Example 1 had a $t_B$ of 150 nm or more and 500 nm or less and a $t_D/t_B$ of 0.55 or more and 1.65 or less, but had no inorganic oxide layer C, and thus was inferior in the barrier property and was unable to suppress a change in color. The barrier films of Comparative Examples 2 to 15 were unable to suppress a change in color because at least one of $t_B$ and $t_D/t_B$ was out of the predetermined range.

REFERENCE SIGNS LIST

10: Light-transmitting base material
21: Inorganic oxide layer A
22: Inorganic oxide layer C
30: Organic coating layer B
40: Primer layer D
50: Quantum dot-containing layer
100: Barrier film
100a: Barrier film
100b: Barrier film
200: Wavelength conversion sheet
210: Light source
220: Optical plate
221: Light guide plate
222: Diffusing plate
230: Reflector
240: Prism sheet
300: Backlight
301: Edge-lit type backlight
302: Direct-lit type backlight

The invention claimed is:

1. A barrier film for a wavelength conversion sheet, comprising an inorganic oxide layer A, an organic coating layer B, an inorganic oxide layer C, and a primer layer D in presented order on a light-transmitting base material, wherein
the organic coating layer B comprises polyvinyl alcohol,
the primer layer D comprises a polyurethane-based resin composition, and
thicknesses of the light-transmitting base material, the inorganic oxide layer A, the organic coating layer B, the inorganic oxide layer C, and the primer layer D are defined as $t_0$, $t_A$, $t_B$, $t_C$, and $t_D$, respectively;
$t_B$ is 150 nm or more and 500 nm or less; and
$t_D/t_B$ is 0.55 or more and 1.65 or less.

2. The barrier film according to claim 1, wherein the inorganic oxide layer A and the inorganic oxide layer C comprise aluminum oxide or silicon oxide.

3. A wavelength conversion sheet comprising: a quantum dot-containing layer comprising a quantum dot; and barrier films respectively laminated on both sides of the quantum dot-containing layer, wherein the barrier film is the barrier film according to claim 1 and the barrier film is laminated such that a surface of an opposite side thereof from the light-transmitting base material faces a side of the quantum dot-containing layer.

4. A backlight comprising: at least one light source that emits primary light; an optical plate that is disposed adjacent to the light source and is for light guiding or diffusion; and a wavelength conversion sheet disposed on a light going-out side of the optical plate, wherein the wavelength conversion sheet is the wavelength conversion sheet according to claim 3.

5. A liquid crystal display device comprising: a backlight; and a liquid crystal panel, wherein the backlight is the backlight according to claim 4.

6. The barrier film according to claim 1, wherein a content of the polyurethane-based resin composition based on the total amount of the primer layer D is 40% by mass or more.

7. The barrier film according to claim 1, wherein $t_D/t_B$ is 0.55 or more and 0.93 or less or 1.12 or more and 1.65 or less.

8. The wavelength conversion sheet according to claim 3, wherein the quantum dot-containing layer is in contact with both of the primer layers D disposed on both sides of the quantum dot-containing layer.

9. A barrier film for a wavelength conversion sheet, comprising an inorganic oxide layer A, an organic coating layer B, an inorganic oxide layer C, and a primer layer D in presented order on a light-transmitting base material, wherein
thicknesses of the light-transmitting base material, the inorganic oxide layer A, the organic coating layer B, the inorganic oxide layer C, and the primer layer D are defined as $t_0$, $t_A$, $t_B$, $t_C$, and $t_D$, respectively;
$t_B$ is 150 nm or more and 500 nm or less; and
$t_D/t_B$ is 0.55 or more and 0.93 or less or 1.12 or more and 1.65 or less.

* * * * *